United States Patent [19]
Bingham et al.

[11] Patent Number: 5,821,533
[45] Date of Patent: Oct. 13, 1998

[54] AUTOMATIC PULSE TOP OPTIMIZATION CIRCUIT FOR AN IONIZING RADIATION SPECTROSCOPY SYSTEM

[75] Inventors: Russell David Bingham; Jesse Ursery, Jr., both of Knoxville, Tenn.

[73] Assignee: EG&G Instruments, Inc., Oak Ridge, Tenn.

[21] Appl. No.: 807,753

[22] Filed: Feb. 27, 1997

Related U.S. Application Data

[63] Continuation-in-part of Ser. No. 782,240, Jan. 14, 1997, and Ser. No. 807,754, Feb. 27, 1997.
[51] Int. Cl.$^6$ .............................. H03H 17/00; G01T 1/22
[52] U.S. Cl. ..................... 250/252.1; 250/336.1; 250/370.01; 364/724.011
[58] Field of Search ............... 250/252.1, 336.1, 250/370.06, 370.01; 327/180, 172, 14, 15, 552, 309, 311; 364/724.011, 724.013, 724.014, 724.17, 724.19

[56] References Cited

U.S. PATENT DOCUMENTS 4,468,705  8/1984  Burton ........................................ 327/15
4,866,400  9/1989  Britton, Jr. et al. .................... 330/305

FOREIGN PATENT DOCUMENTS

0612149A1  8/1994  European Pat. Off. .......... 364/724.19

*Primary Examiner*—Edward P. Westin
*Assistant Examiner*—Richard Hanig
*Attorney, Agent, or Firm*—Iandiorio & Teska

[57] ABSTRACT

An automatic pulse top optimization circuit for an ionizing radiation spectroscopy system includes a conversion circuit, responsive to random analog input pulses passing through the system, for converting the random analog pulses to digital pulses; a programmable shaping filter, responsive to the digital pulses, for producing an output of predetermined shape which maximizes the precision and accuracy of the anticipated measurement; pulse shape sampling means including means for defining a window for sampling the top of the pulse and means for sampling the pulses during that window to determine the presence of a deviation from the predetermined shape; and a control circuit, responsive to the pulse shaped sampling means, for programming the programmable shaping filter to compensate for a deviation in the predetermined shape.

15 Claims, 6 Drawing Sheets

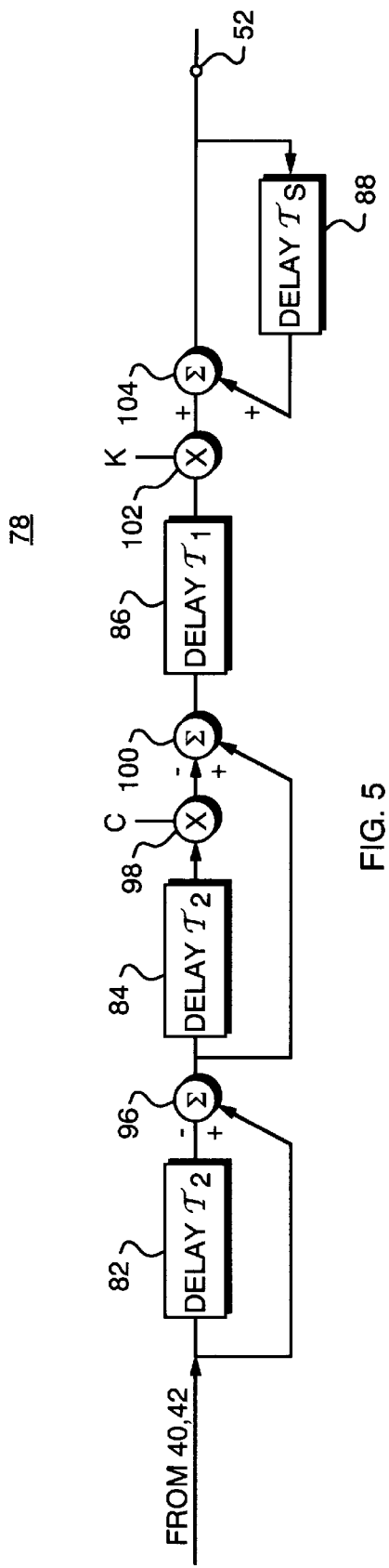
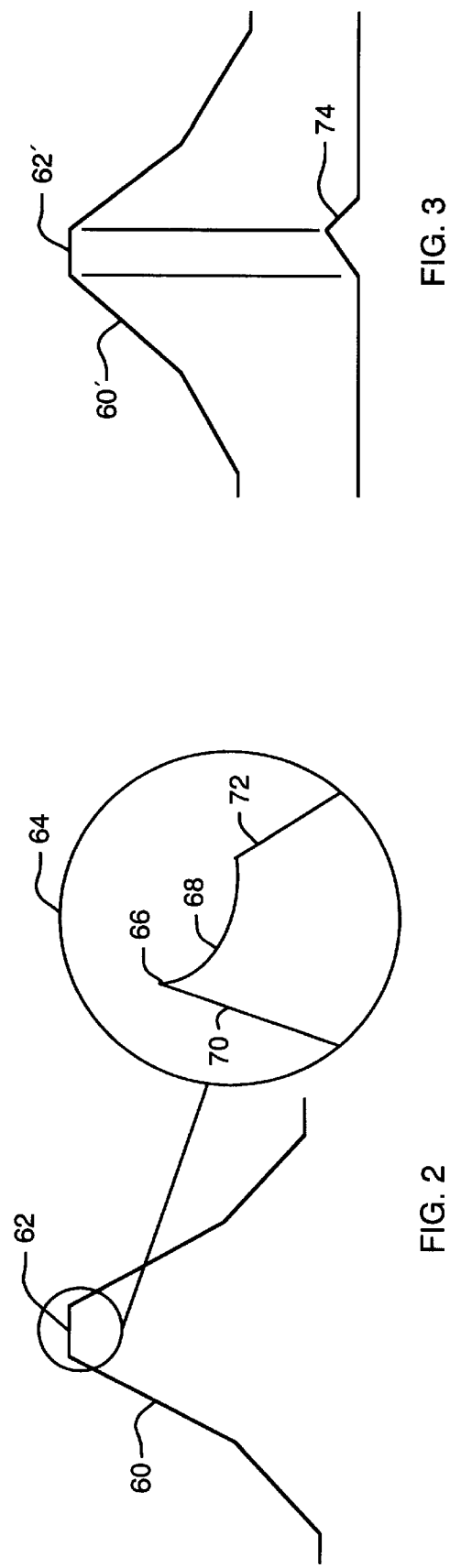
FIG. 5
FIG. 3
FIG. 2

AUTOMATIC PULSE TOP OPTIMIZATION CIRCUIT FOR AN IONIZING RADIATION SPECTROSCOPY SYSTEM

RELATED CASES

This application is a continuation-in-part of U.S. patent application Ser. No. 08/782,240 filed Jan. 14, 1997, "Automatic Pole Zero Adjustment Circuit for an Ionizing Radiation Spectroscopy System", Bingham et al.; and U.S. patent application Ser. No. 08/807,754 filed on even date herewith entitled "Gated Base Line Restorer System", Russell David Bingham.

FIELD OF INVENTION

This invention relates to an automatic pulse top optimization circuit for an ionizing radiation spectroscopy system.

BACKGROUND OF INVENTION

Radiation detection systems generally employ a radiation detector such as a germanium or scintillation detector to detect radiation such as alpha or gamma rays from a radiation source. The detection of such energy results in a charge pulse whose amplitude is proportional to the energy of the incident radiation. The charge pulse is converted to a voltage pulse by a charge sensitive preamplifier. The voltage pulse is filtered with an analog or digital shaping filter to maximize the precision and accuracy of the pulse amplitude measurement. Usually the measured value is histogrammed to form a spectrum which indicates the number of pulses of a particular amplitude which have been processed by the system as a function of the amplitude of the pulse.

Since the measured amplitude of the pulse is proportional to the energy of the incident radiation, the spectrum may also be interpreted to indicate the number of alpha or gamma-rays of a particular energy which have been processed by the system as a function of the energy of the incident radiation. To make this conversion between measured amplitude and energy, a radiation source of known characteristics is analyzed by the detection system. Since the construction of the radiation source is known, features in the spectrum can be used to calibrate the detection system. For example, if a CO-60 source is analyzed by a detection system, two peaks will appear in the spectrum. The energy of the higher peak is known to occur at 1332.5 keV and the energy of the lower peak is known to occur at 1173.237 keV. With this information, a mapping can be made between the measured amplitude of the pulse and the energy of the incident radiation.

In such radiation detection systems which employ germanium detectors, the output pulse from the shaping filter often has a flat top region so that the output pulse is similar in shape to a trapezoid. This flat top region is required to compensate for ballistic deficit errors. Ballistic deficits occur because a variable amount of time, usually 400 ns or less, is required for the charge from an event to move through the detector to the electrodes of the detector. This collection time variation causes the preamplifier output pulse to have variable rise time which in turn affects the shaping filter output pulse and prevents the output pulse from reaching the proper amplitude. The inclusion of a flat top in the filter provides extra time for the output pulse to reach the proper amplitude.

A second reason for preferring trapezoidal (flat top) pulse shapes in the sampled data system is to avoid sampling timing errors. If a triangular or other peaked pulse is sampled, depending on where the samples occur relative to the timing of the input pulse, no sample may exist at the peak of the pulse. With a flat top longer than one sample period, a sample point will always exist at the peak of the pulse and the pulse amplitude can be easily measured.

This, however, raises a problem: in order to insure accuracy the flat top must be truly flat. In an ideal spectroscopy system, the flat top of the pulse would be perfectly flat. However, in reality distortion in the pulse shape occurs due to non-ideal components in the charge sensitive preamplifier. This distortion might manifest itself as a small overshoot on the preamplifier output pulse. This non-ideal component of the signal shape is passed through the shaping filter and appears at the output of the shaping filter as a small overshoot on the peak of the filtered pulse. Other non-ideal components can cause similar deviations from the desired flat top.

SUMMARY OF INVENTION

It is therefore an object of this invention to provide an automatic pulse top optimization circuit.

It is a further object of this invention to provide such an automatic pulse top optimization circuit for an ionizing spectroscopy system.

It is a further object of this invention to provide such an automatic pulse top optimization circuit which eliminates pulse top distortion and errors associated therewith.

It is a further object of this invention to provide such an automatic pulse top optimization circuit which senses pulse top shape and corrects it to a predetermined shape.

It is a further object of this invention to provide such an automatic pulse top optimization circuit which compensates each pulse to produce a virtually flat top pulse.

The invention results from the realization that an automatic pulse top optimization circuit can be effected by defining a window for sampling a pulse top, determining any deviation between the actual pulse top shape and a desired shape, and then generating a correction signal which just compensates for that distortion to return the pulse top to the desired shape which typically in ionizing radiation spectroscopy system is a flat top.

This invention features an automatic pulse top optimization circuit for an ionizing radiation spectroscopy system which includes a conversion circuit responsive to random analog input pulses passing through the system for converting the random analog pulses to digital pulses. A programmable shaping filter is responsive to the digital pulses for producing an output of predetermined shape which maximizes the precision and accuracy of the amplitude measurement. There are pulse shape sampling means including means for defining a window for sampling the top of the pulses and means for sampling the pulses during that window to determine the presence of a deviation from the predetermined shape. A control circuit responsive to the pulse shape sampling means programs the programmable shaping filter to compensate for deviation in the predetermined shape.

In a preferred embodiment the programmable shaping filter may include a main filter, a correction filter, and a summing circuit for combining the outputs of the main filter and correction filter. The correction filter may include a filter circuit for generating a compensating waveform and an adjustment device for adjusting the amplitude of the waveform to create the correction signal. The filter circuit may include a first time delay device for introducing a first delay, a second time delay device for introducing a second delay, a third time delay device for introducing a third delay and a fourth time delay device for introducing a fourth delay. The conversion circuit may be an A/D converter. The first and second time delay devices may introduce time delays approximately equal to the period of the top of the pulses. The third time delay device may introduce a time delay approximately equal to the rise time of the digital pulse. The fourth time delay device may introduce a time delay approximately equal to the period of the A/D converter. The time delay devices may be connected in series, and the first time delay device may include first time delay means and a first summing circuit for combining the undelayed and delayed signal from the first time delay means. The analog input pulse may have an exponential decay and the second time delay device may include second time delay means, first means for multiplying the output of the second time delay by a constant which is a function of the decay time of the exponential analog pulse, and a second summing circuit for combining the undelayed signal input to the second time delay means and the output of the first means for multiplying. The third time delay device may include third time delay means and second means for multiplying the output of the third time delay means with a scaling function to scale the correction signal. The fourth time delay device may include a fourth time delay means and a third summing circuit for combining the outputs of the second multiplying means and the fourth time delay means. The fourth time delay means may receive its input from the output of the third summing circuit.

DISCLOSURE OF PREFERRED EMBODIMENT

Other objects, features and advantages will occur to those skilled in the art from the following description of a preferred embodiment and the accompanying drawings, in which:

FIG. 2 depicts a waveform illustrating the distortion of a flat top pulse which occurs in the system of FIG. 1;

FIG. 3 depicts a correction signal as generated in accordance with this invention and the resulting waveform of FIG. 2 after it has been corrected;

FIG. 5 is a more detailed schematic block diagram of the correction filter of FIG. 4;

Figure 1:
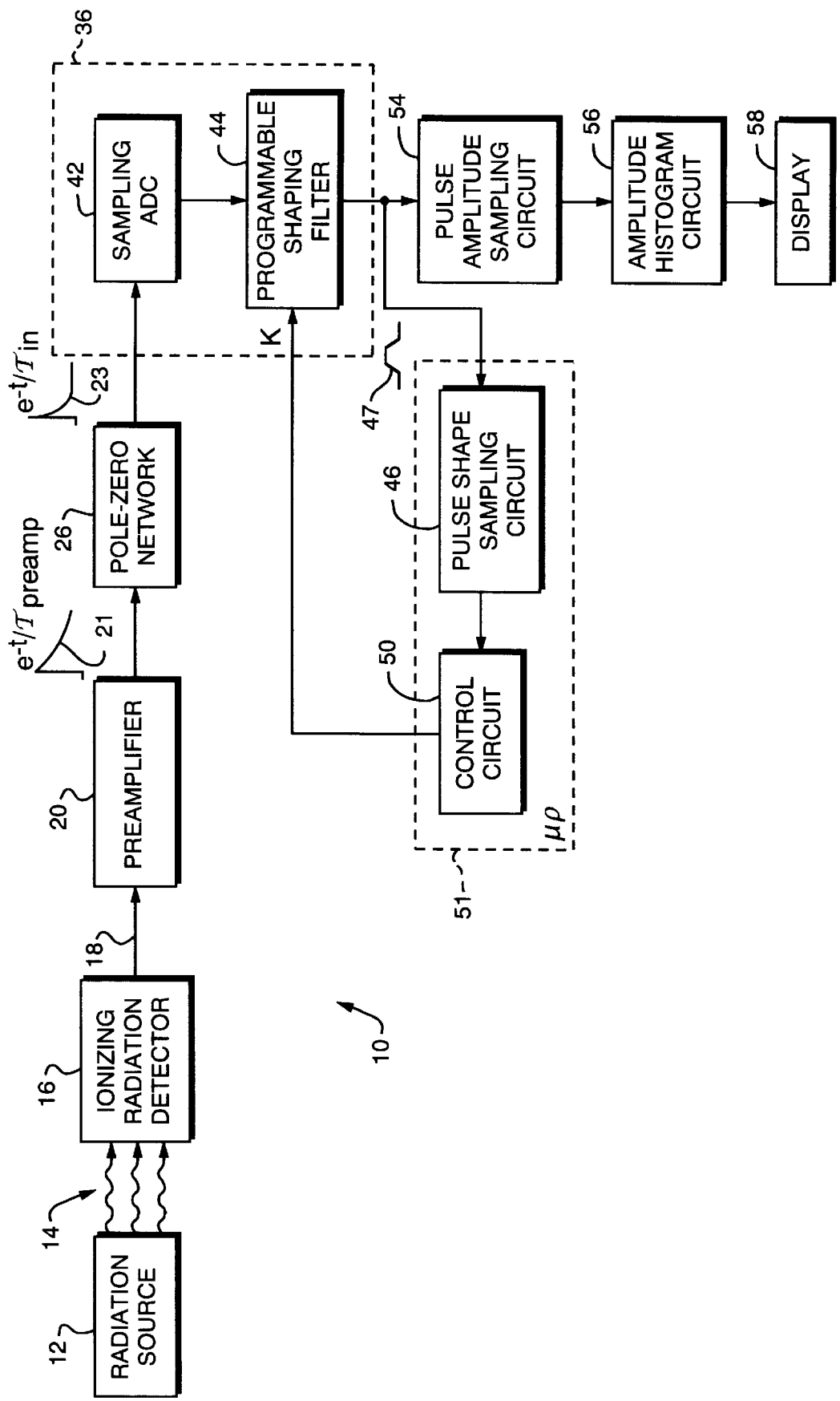
FIG. 1 is a schematic block diagram of an ionizing radiation spectroscopy system including an automatic pulse top optimization circuit according to this invention.

There is shown in FIG. 1 an automatic pulse top adjustment circuit including a source 12 of radiation such as alpha or gamma rays. Each quantum of radiation 14 is sensed by ionizing radiation detector 16 and converted to charge which is submitted to preamplifier 20. Preamplifier 20 converts the charge to a voltage pulse which is typically exponential in shape having a decay time constant defined as $\tau_{preamp}$. The output of the preamplifier may be delivered to a pole-zero network 26 or may be delivered directly to the sampling ADC 42. If pole-zero network 26 is included, the input to the sampling ADC 42 would still be exponential in shape, but the time constant would be reduced. For simplicity, the time constant of the exponential which is analyzed by sampling ADC 42 is referred to as $\tau_{in}$. Sampling ADC 42 samples and converts the analog signal to a digital signal and then submits it to programmable shaping filter 44. Programmable shaping filter 44 transforms the exponentially shaped pulse into a pulse which better maximizes the precision and accuracy of the pulse amplitude measurement. The pulse typically has flat top as shown on waveform 47.

The output from programmable digital shaping filter 44 appearing at node 52 is supplied to the pulse shape sampling circuit 46 whose output is delivered to control circuit 50. Circuit 46 and 50 can be implemented in a digital signal microprocessor 51 such as a Motorola DSP56002 programmed in accordance with FIG. 7. Circuit 46 determines the pulse top distortion and circuit 50 generates a signal in response thereto to program filter 44 in the initialization process to produce the appropriate correction signal to compensate for the distortion.

The output at terminal 52 from digital shaping filter 44 is also delivered to pulse amplitude sampling circuit 54 which samples the peak amplitude of each pulse and submits it to an amplitude histogram circuit 56 which creates a histogram of the number of pulses at the different voltage levels thereby displaying one or more peaks which identify the nature of the radiant emission detected. The histogram may be viewed in display 58.

A typical flat top pulse 60, FIG. 2, which may occur at the output of shaping filter 44, FIG. 1, may appear to have a perfectly flat top 62. But in reality when looked at in magnification as shown in exploded balloon 64, the top may be distorted having a peak 66 which slopes negatively or downwardly as at 68 from the leading edge 70 to the trailing edge 72.

In accordance with this invention it is understood that by applying a suitable waveform, for example the triangular waveform 74, FIG. 3, of the proper shape and at the proper time, the distortion shown in balloon 64, FIG. 2, could be compensated for so that a truly flat top 62', FIG. 3, could be restored to pulse 60'.

Figure 4:
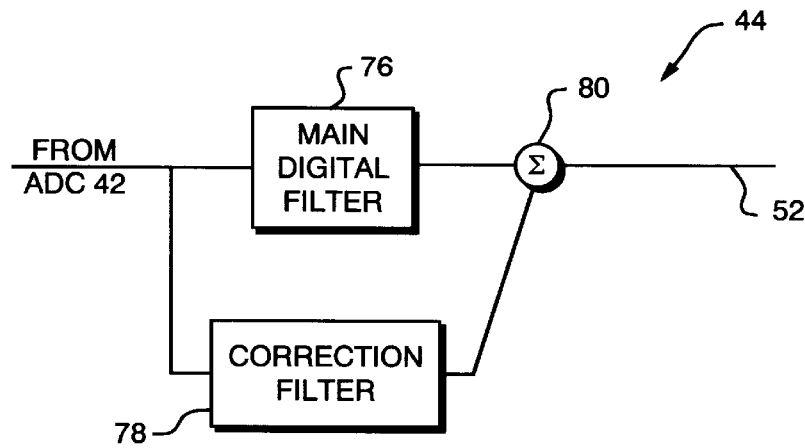
FIG. 4 is a more detailed block diagram of the programmable digital shaping filter of FIG. 1.

In accordance with this invention this is accomplished in shaping filter 44 which may include a main digital filter 76, FIG. 4, and a correction filter 78 according to this invention whose outputs are combined in summing circuit 80. It is correction filter 78 that provides the triangular or other shape correction wave which is combined in summing circuit 80 with the distorted signal, FIG. 2, from main digital filter 44 to result in a corrected, undistorted pulse with flat top 60' as shown in FIG. 3.

Figure 6:
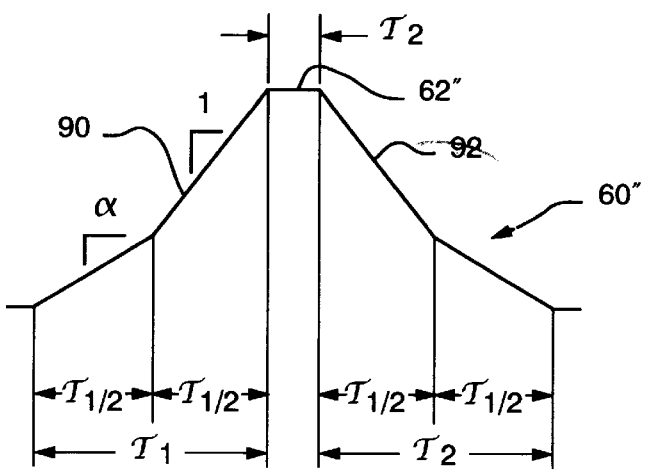
FIG. 6 illustrates a typical flat top pulse defining the times $\tau_1$ and $\tau_2$.

In this embodiment, corrective filter 78, FIG. 5, includes four delay circuits: delay circuits 82 and 84, each of which inserts a delay of $\tau_2$; delay circuit 86 which inserts a delay of $\tau_1$; and delay circuit 88 which inserts a delay of $\tau_S$. $\tau_1$ is the typical rise time 90, FIG. 6, of a typical pulse 60". $\tau_2$ is the period of the flat top 62". $\tau_S$ typically is made as small as possible, but no smaller than the period of the sampling ADC 42. Typically $\tau_S$ will be the ADC sampling period. The output from time delay circuit 82 is subtracted from the undelayed signal in summing circuit 96. The output of time delay circuit 84 is first multiplied by the constant C in multiplier 98 and then subtracted from the undelayed signal in summing circuit 100. Constant C is derived from $e^{-\tau_2/\tau_{in}}$, where $\tau_{in}$ is the decay time constant of the exponential pulse 23 shown in FIG. 1. The output of multiplier 102 is combined in summing circuit 104 with the output of time delay circuit 88 which is connected in a feedback loop from the output of summing circuit 104. The delay of circuits 82, 84 and 88 in conjunction with summing circuits 96, 100 and 102 along with multiplier 98 constitutes a filter which produces the desired shape of the correction pulse. Also included in the filter is time delay circuit 86 which shifts the entire correction signal so that it is properly aligned on the flat top. Multiplier 102 applies the appropriate gain to the correction signal such that the correction signal properly cancels the slope on the flat top. The programming of programmable shaping filter 44 is achieved through contact of constant K. For example, if the slope is negatives constant K is increased so that the correction pulse becomes larger and would tend to flatten the top of the pulse whereas if the pulse distortion slope were positive, K would be decreased to cancel the positive slope.

Figure 9:
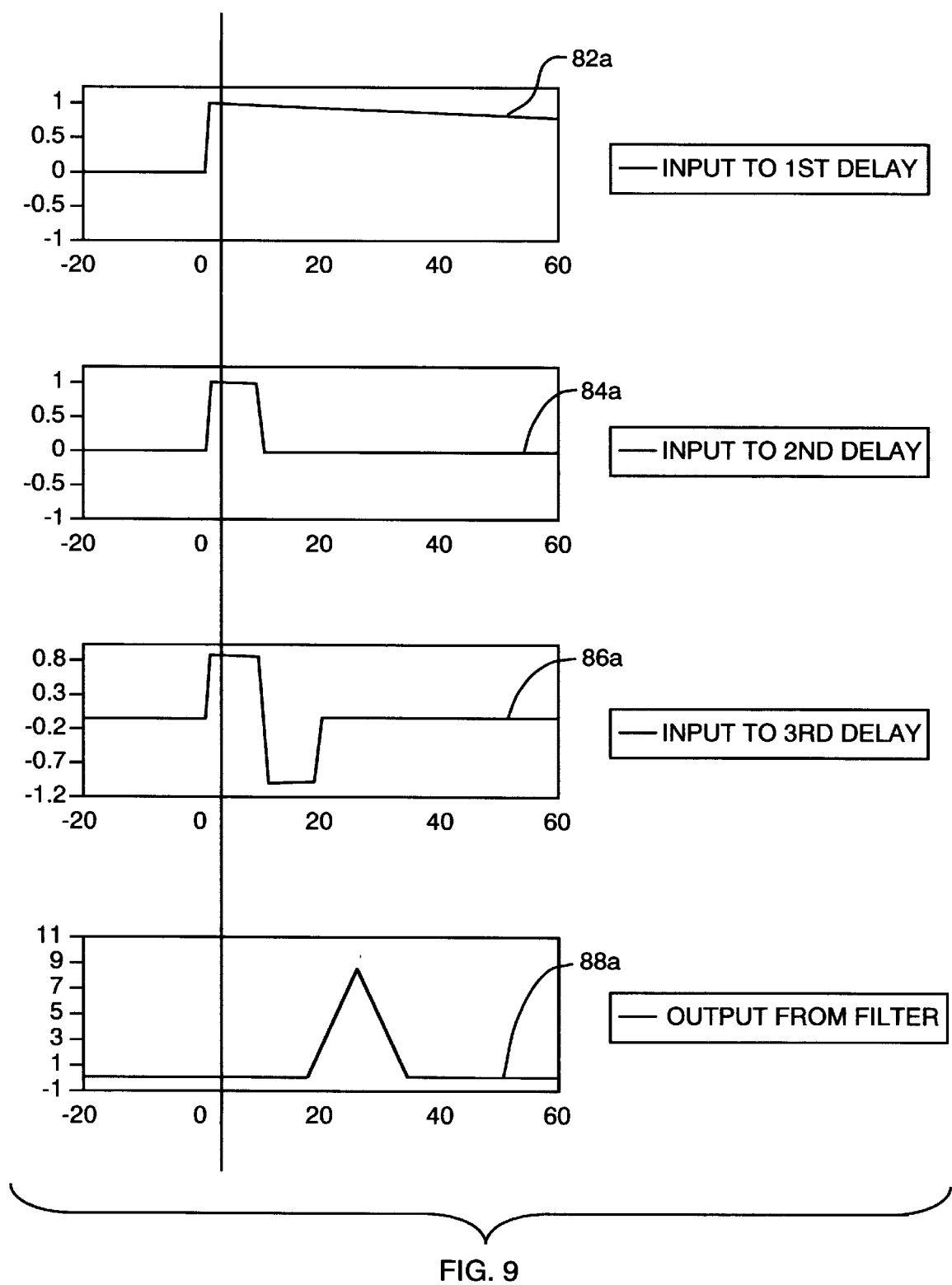
FIG. 9 depicts a series of waveforms that occur in the correction filter of FIG. 5 when there is no pole-zero network in the system of FIG. 1.
Figure 10:
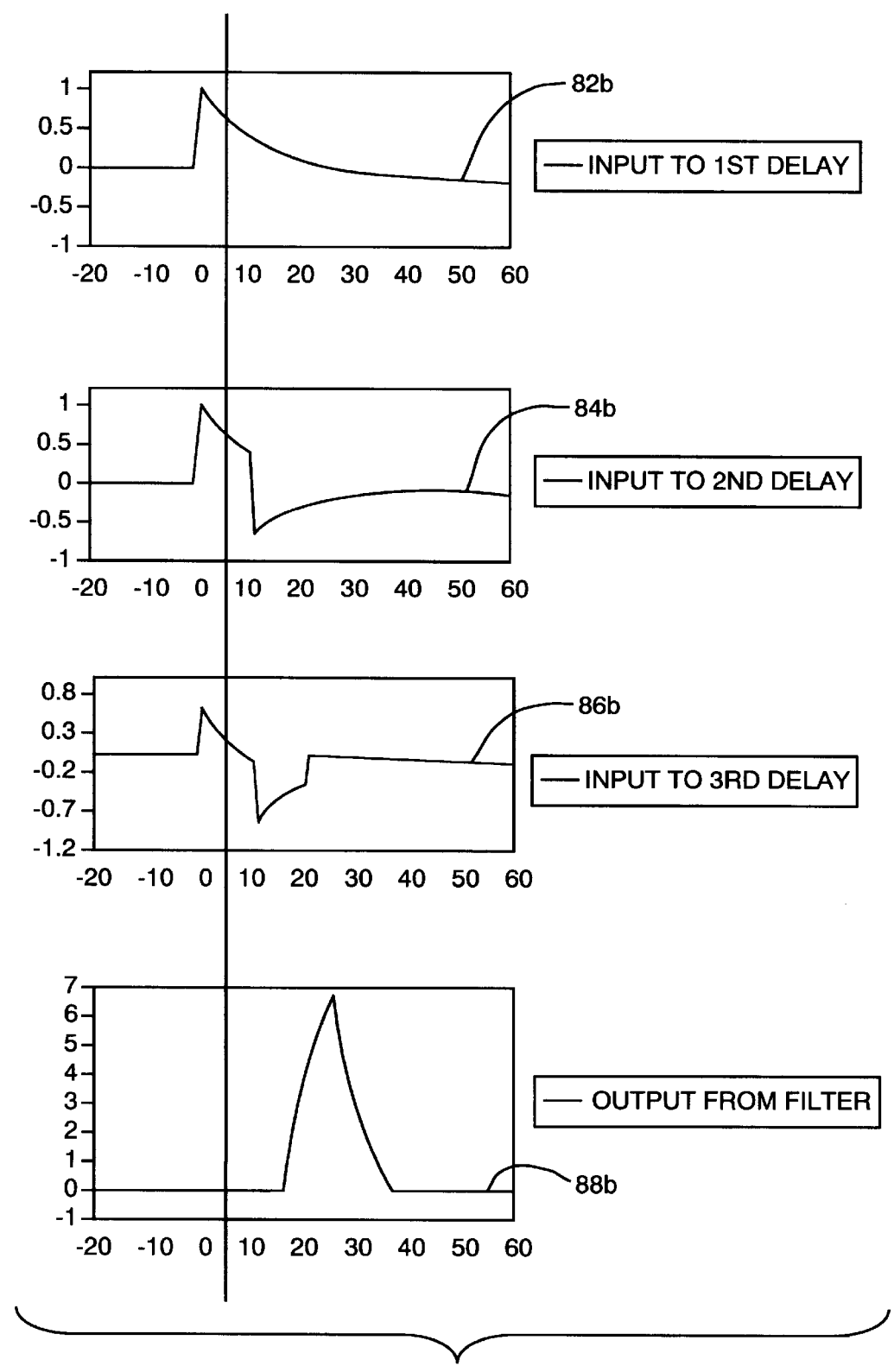
FIG. 10 is a view similar to FIG. 9 when there is a pole-zero network present in the system of FIG. 1.

If pole-zero network 26, FIG. 1, is not provided, then the waveforms at the inputs of delays 82, 84, 86 and 88 in FIG. 5 are shown as indicated at 82a, 84a, 86a and 88a, FIG. 9. Thus the final output from the filter 88a can be seen to be an idealized triangular shape. The shape is not quite so perfect a triangle, although still triangular. When a pole-zero network is included, the wave shapes at the input to delays 82, 84, 86 and 88 take on the form shown at 82b, 84b, 86b and 88b in FIG. 10.

In operation, the automatic pulse top optimization circuit according to this invention is operated to initially set the value of K automatically, after which the circuit continues without further need for adjustment or interference. This initialization operation is shown for the digital signal microprocessor 51 in the flow chart of FIG. 7. Operation is begun by either manual or software-actuated initiation of the Start Pulse Optimization sequence in step 142. A start command is desirable since this automatic pulse optimization adjustment may be necessary only at infrequent intervals. Once the sequence has begun a waveform is captured to determine the pulse top shape as indicated in step 144. Typically, but not necessarily, the waveform incudes four sample points before the peak of the pulse and four after the peak of the pulse. Next, in step 146 a determination is made as to whether the measurement was invalid and should be rejected. The measurement is invalid if it was distorted by other pulses or by an overload. Overload occurs when the code from the A/D converter exceeds a maximum allowed value. Pulse pile up is determined by a pile up rejector such as shown in U.S. Pat. No. 4,866,400 and described in *Quantitive X-ray Spectroscopy*, by Ron Jenkins, R. W. Gould and Dale Gedcke, Marcel Delsker, Inc., New York, N.Y. 1981, p. 183, both of which are incorporated herein by reference. It is also determined to be invalid if its peak height is less than a predetermined level, for example, 0.6% of the full scale range of the spectrometer. If it is subject to such defects then the system rejects the event in step 148 and returns to the sampling step in 144. A number of waveform samples from the digital filter output are taken for each adjustment. The number may be 1, 2, 8 or hundreds depending upon the averaging desired to increase accuracy. In this embodiment, eight samples are used.

Next the maximum point is located in the waveform in step 149. In step 150, each sample is examined to see if the top is not flat but slanted one way or the other: is the top sloped down from leading to trailing edge or sloped up? Specifically inquiry is made as to whether the point R points after the maximum is greater than the point S points before the maximum. If R is greater, then the value is set to 1 in step 152. If it is not, then the value is set to −1 in step 154. In either case the value of the eight most recent samples is summed in step 156. Inquiry is then made in step 158 as to whether the predetermined number of samples, in this case eight, have been processed. If not, the system returns to the sample step 144. If the predetermined number of samples has been taken then inquiry is made as to whether the sum of the eight samples is equal to or less than zero beginning in step 160. If the sum is zero or less the value of K is reduced by one unit in box 162. If the sum is greater than zero, K is increased by one unit in box 164. Faster convergence can be achieved by changing the step size in boxes 162 and 164 in accordance with recent history. For example, the size of the adjustment can be determined by the number of consecutive adjustments previously taken in the same direction, either up or down: that is, to compensate for either positive or negative slope on the flat top. The first adjustment is typically always one least significant bit in the constant K. If two adjustments are taken in the same direction then the adjustment size is doubled. This can occur again and again up to the maximum of 8192 in this embodiment. If an adjustment is taken in the reverse direction the adjustment size is halved and the adjustment size increases are disabled for four adjustments in the same direction. In step 166, inquiry is made as to whether the steps alternate between increasing and decreasing four times in the last eight while the adjustment size is one. If it has, then the system is told to stop in step 168. If it has not, then the system returns to sample the pulse waveform in step 144.

Figure 8:
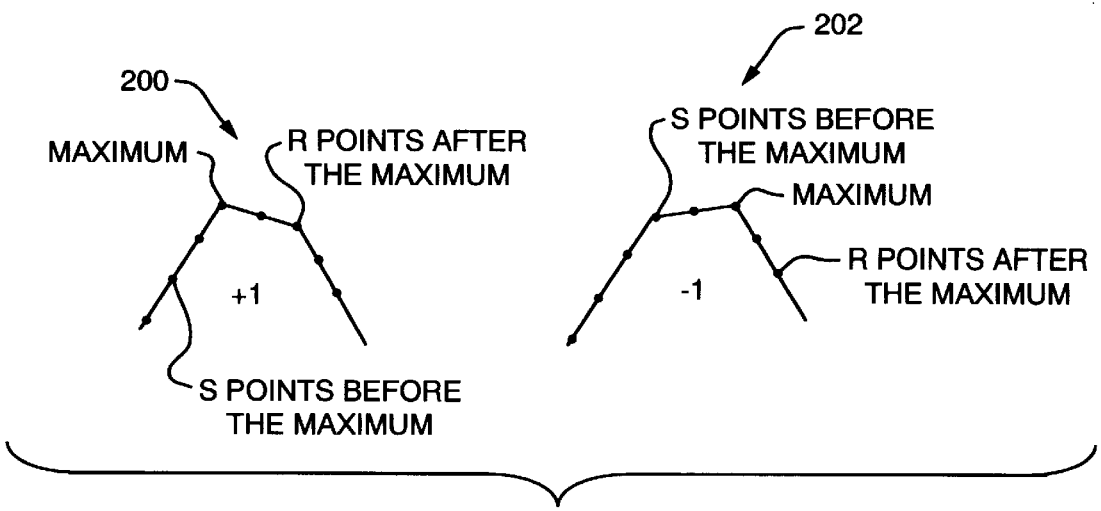
FIG. 8 depicts two illustrative waveforms showing the two different slopes that are possible in a distortion of a flat top pulse as referred to in FIG. 7.
Figure 7:
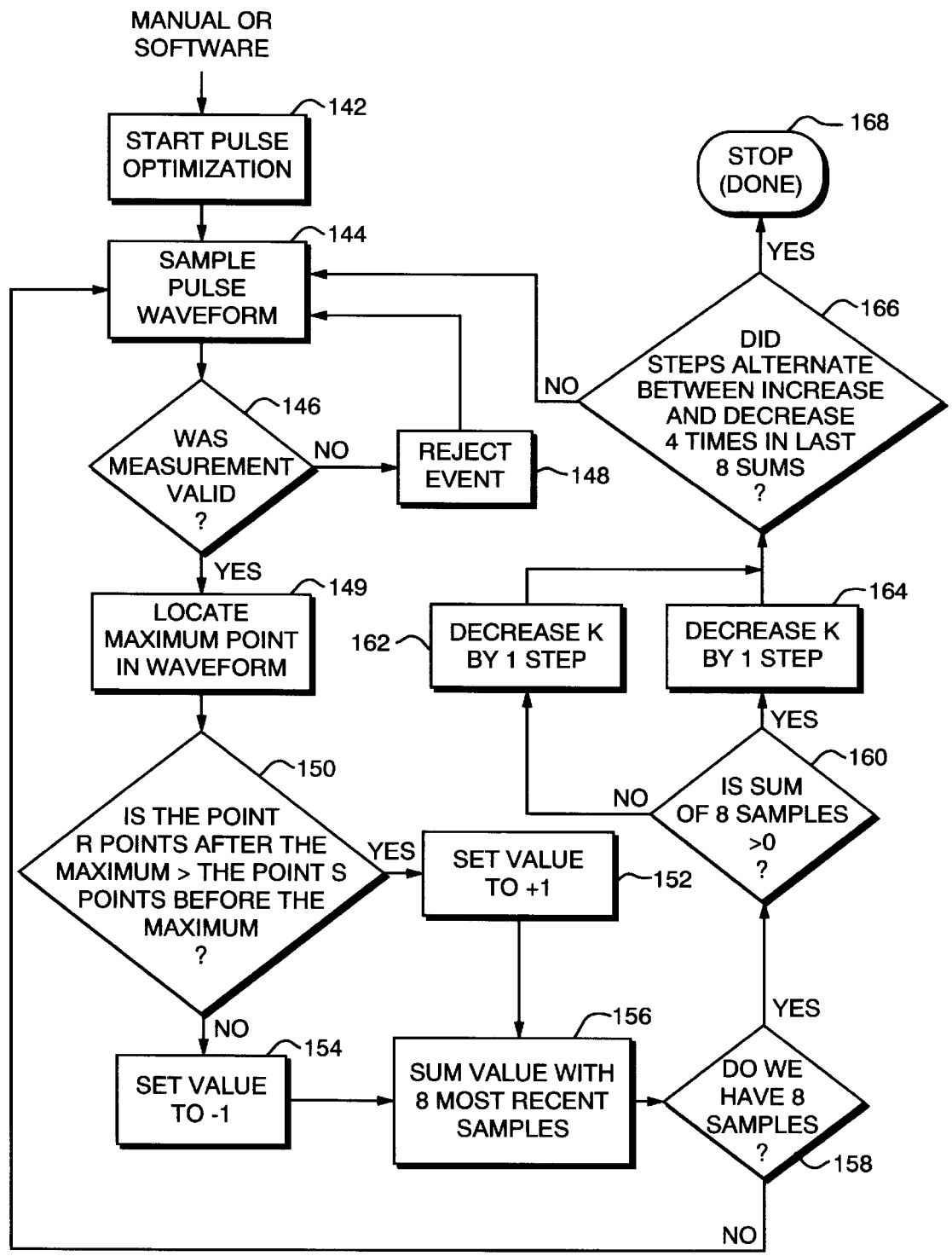
FIG. 7 is a flow chart of software which can be used to operate the automatic pulse shape sampling circuit and control circuit of FIG. 1 implemented in a digital signal microprocessor.

The analysis of the R and S points in steps 150 and the setting of the values to +1 and −1 in steps 152 and 154 of FIG. 7 can be understood more clearly by reference to FIG. 8 where the maximum or peak point has been shown for a negative slope 200 which produces a +1 in step 152 or a positive slope 202 which produces −1 in step 154.

Although specific features of the invention are shown in some drawings and not others, this is for convenience only as each feature may be combined with any or all of the other features in accordance with the invention.

Other embodiments will occur to those skilled in the art and are within following claims:

What is claimed is:

1. An automatic pulse top optimization circuit for an ionizing radiation spectroscopy system comprising:

a conversion circuit, responsive to random analog input pulses passing through the system, for converting said random analog pulses to digital pulses;

a programmable shaping filter, responsive to said digital pulses, for producing an output of predetermined shape which maximizes the precision and accuracy of the amplitude measurement;

pulse shape sampling means including means for defining a window for sampling the top of said pulses and means for sampling said pulses during that window to determine the presence of a deviation from said predetermined shape; and a control circuit, responsive to said pulse shape sampling means, for programming said programmable shaping filter to compensate for a deviation in said predetermined shape.

2. The automatic pulse top optimization circuit for an ionizing radiation spectroscopy system of claim 1 in which said programmable shaping filter includes a main filter, a correction filter and a summing circuit for combining the outputs of said main filter and correction filter.

3. The automatic pulse top optimization circuit for an ionizing radiation spectroscopy system of claim 2 in which said correction filter includes a filter circuit for generating a compensating waveform and an adjustment device for adjusting the amplitude of said waveform to create said correction signal.

4. The automatic pulse top optimization circuit for an ionizing radiation spectroscopy system of claim 3 in which said filter circuit includes a first time delay device for introducing a first delay.

5. The automatic pulse top optimization circuit for an ionizing radiation spectroscopy system of claim 4 in which said filter circuit includes a second time delay device for introducing a second delay.

6. The automatic pulse top optimization circuit for an ionizing radiation spectroscopy system of claim 3 in which said filter circuit includes a third time delay device for introducing a third delay.

7. The automatic pulse top optimization circuit for an ionizing radiation spectroscopy system of claim 6 in which said filter circuit includes a fourth time delay device for introducing a fourth delay.

8. The automatic pulse top optimization circuit for an ionizing radiation spectroscopy system of claim 1 in which said conversion circuit is an A/D converter.

9. The automatic pulse top optimization circuit for an ionizing radiation spectroscopy system of claim 8 in which said first and second time delay devices include time delays approximately equal to the period of the top of said predetermined shape pulse.

10. The automatic pulse top optimization circuit for an ionizing radiation spectroscopy system of claim 9 in which said third time delay device includes a time delay approximately equal to the rise time of said predetermined shape pulse.

11. The automatic pulse top optimization circuit for an ionizing radiation spectroscopy system of claim 10 in which said fourth time delay device includes a time delay approximately equal to the period of the A/D converter.

12. The automatic pulse top optimization circuit for an ionizing radiation spectroscopy system of claim 7 in which said time delay devices are connected in series and said first time delay device includes first time delay means and a first summing circuit for combining the undelayed and delayed signal from said first time delay means.

13. The automatic pulse optimization circuit for an ionizing radiation spectroscopy system of claim 12 in which said analog input pulse has an exponential decay and said second time delay device includes second time delay means, first means for multiplying the output of said second time delay means by a constant which is a function of the decay time of the exponential analog pulse, and a second summing circuit for combining the undelayed signal input to said second time delay means and the output of said first means for multiplying.

14. The automatic pulse top optimization circuit for an ionizing radiation spectroscopy system of claim 13 in which said third time delay device includes third time delay means, and second means for multiplying the output of said third time delay means with a scaling function to scale the correction signal.

15. The automatic pulse top optimization circuit for an ionizing radiation spectroscopy system of claim 14 in which said fourth time delay device includes fourth time delay means and a third summing circuit for combining the outputs of said second multiply means and said fourth time delay means, said fourth time delay means receiving its input from the output of said third summing circuit.

* * * * *